United States Patent
Choi et al.

(10) Patent No.: US 7,873,778 B2
(45) Date of Patent: Jan. 18, 2011

(54) APPARATUS FOR STORING PAGE DATA

(75) Inventors: Sung-Up Choi, Hwaseong-si (KR); Sung-Kook Bang, Seoul (KR); Si-Hoon Hong, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 629 days.

(21) Appl. No.: 11/875,317

(22) Filed: Oct. 19, 2007

(65) Prior Publication Data
US 2008/0175065 A1    Jul. 24, 2008

(30) Foreign Application Priority Data
Jan. 23, 2007  (KR) .................... 10-2007-0006961

(51) Int. Cl.
*G11C 14/00*  (2006.01)
*G06F 11/16*  (2006.01)
*G06F 12/16*  (2006.01)

(52) U.S. Cl. .............. 711/103; 365/185.08; 711/162; 714/42

(58) Field of Classification Search ............... None
See application file for complete search history.

(56) References Cited

U.S. PATENT DOCUMENTS

| | | | | |
|---|---|---|---|---|
| 7,170,782 B2 * | 1/2007 | Conley et al. | ........... | 365/185.04 |
| 7,602,642 B2 * | 10/2009 | Choi | ........... | 365/185.09 |
| 2005/0172086 A1 * | 8/2005 | Kawai | ........... | 711/154 |
| 2006/0126394 A1 | 6/2006 | Li | | |
| 2006/0198202 A1 | 9/2006 | Erez | | |

FOREIGN PATENT DOCUMENTS

KR    10-2006-0056236 A    5/2006

* cited by examiner

*Primary Examiner*—Gary J Portka
(74) *Attorney, Agent, or Firm*—Myers Bigel Sibley & Sajovec, P.A.

(57) ABSTRACT

A method of operating a non-volatile memory can include backing-up first data successfully programmed to a first target page of a non-volatile memory to provide local back-up data. A determination can be made that programming of second data to the first target page has failed and the local back-up data can be programmed to a second target page in a second block of the non-volatile memory.

5 Claims, 6 Drawing Sheets

APPARATUS FOR STORING PAGE DATA

CROSS-REFERENCE TO RELATED APPLICATION

This application claims priority under 35 U.S.C. §119 from Korean Patent Application No. 10-2007-0006961 filed on Jan. 23, 2007 the disclosure of which is hereby incorporated by reference in its entirety.

FIELD OF THE INVENTION

The present invention relates to the field of electronics in general, and more particularly, to methods of operating non-volatile memories and related devices.

BACKGROUND

Non-volatile memory such as Flash Electronically Erasable Programmable Read-Only Memory (EEPROM) is widely used in portable information terminals such as a digital still camera, a MP3 player, mobile, a note book, or Personal digital assistants PDAs because non-volatile memory is light, strong against physical impacts, easy to carry out, and may reduce battery consumption volume by operating in low power.

Figure 1:
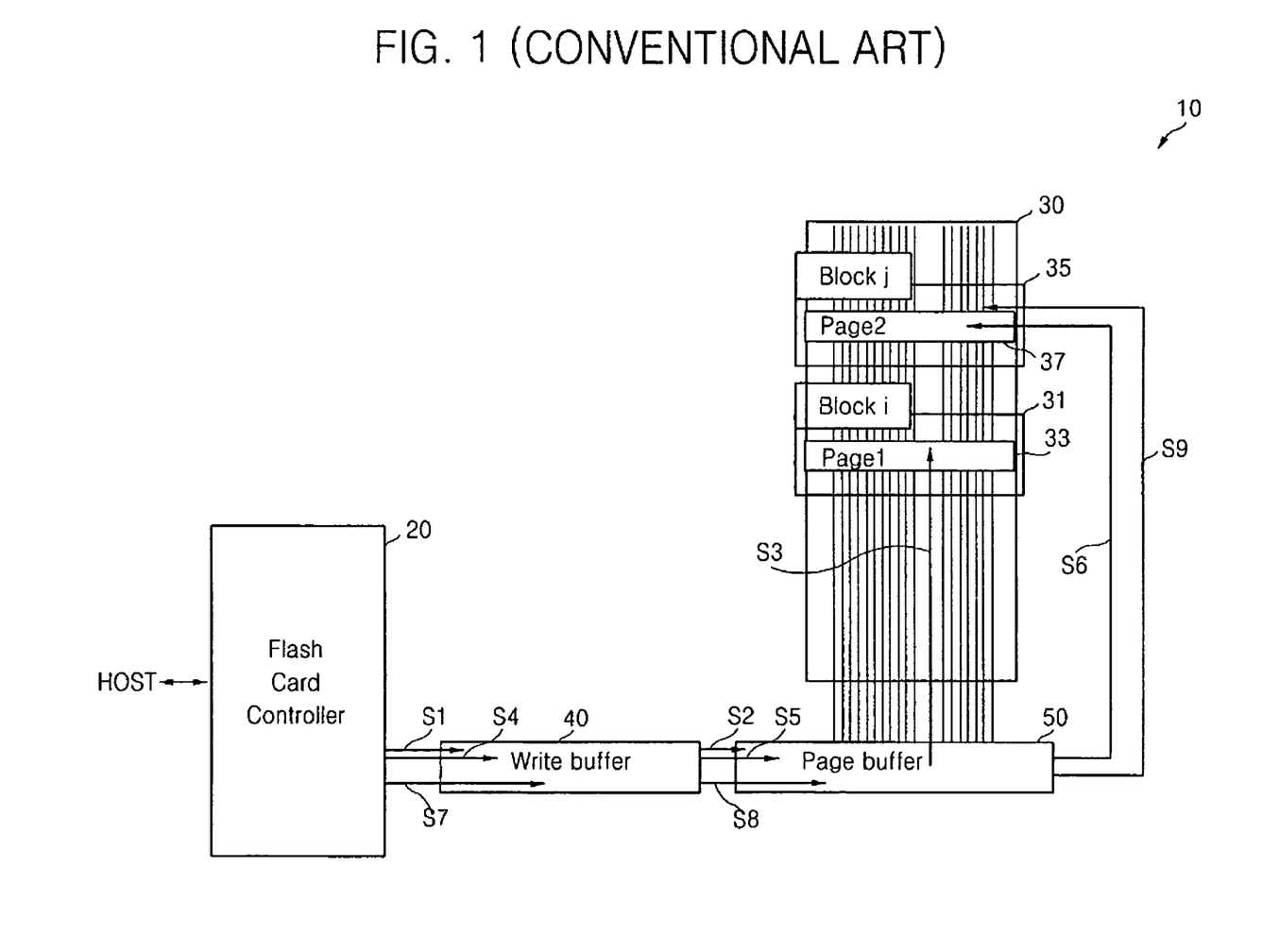
FIG. 1 is a block diagram of conventional non-volatile memory system structure.

FIG. 1 illustrates a block diagram of conventional non-volatile memory system structure. Referring to FIG. 1, the non-volatile memory system 10 includes a controller 20, a non-volatile memory 30 having a plurality of blocks 31 and 35, a write buffer 40, and a page buffer 50. The block i 31 includes a plurality of pages having a first page 33, and the block j 35 includes a plurality of pages including a second page 37. The non-volatile memory 30 includes a plurality of flash EEPROMs and respective pages 33 and 37 include a plurality of flash EEPROMs to store data by page.

Referring to FIG. 1, a process of programming second page data (e.g. Most Significant Bit (MSB) page data) can be explained as follows. Here, a first page data (e.g. Least Significant Bit (LSB) page data) is to be programmed to the first page 33 of the block i 31.

To program the second page data in the first page 33 of the block i 31, a write buffer 40 receives and stores a second page data output from the controller 20 under a control of the controller 20 (S1). And, a second page data loaded in the write buffer 40 is loaded to a page buffer 50 under a control of the controller 20 (S2).

The controller 20, which sends and receives page data to/from a host, tries to program the second page data loaded in the page buffer 50 in a target page (e.g. the first page 33 of the block i 31) (S3). When a programming of the second page data fails in the target page (e.g., the first page 33 of the block i 31), the controller 20 receives a first page data from a host and transmits the received first page data to the write buffer 40 in order to program the second page data again in another target page (e.g., a second page 37 of a block j 35) (S4).

Under control of the controller 20, the first page data loaded in the write buffer 40 is transferred to the page buffer 50 again (S5). And, the first page data loaded in the page buffer 50 is programmed in another target page (e.g., the second page 37 of the block j 35) (S6). Here, the controller 20 may check whether the first page data is successfully programmed or not in responding to a status check signal output from a status register (not shown) of the page buffer 50.

When the first page data is successfully programmed, the controller 20 receives a second page data from the host and transmits the received second page data to the write buffer 40 again (S7). And the second page data loaded in the write buffer 40 is transferred to a page buffer 50 again under a control of the controller 20 (S8). After that, the second page data loaded in the page buffer 50 is programmed in an another target page (e.g., the second page 37 of the block j 35 (S9).

As explained in referring to FIG. 1, after the first page data has already been successfully programmed in a target page (e.g., the first page 33), if programming of the second page data to the target page (e.g., the first page 33) fails, the controller 20 programs the first and second page data received from a host in another target page (e.g., the second page 37).

SUMMARY

A method of operating a non-volatile memory can include backing-up first data successfully programmed to a first target page in a first block of the non-volatile memory to provide local back-up data. A determination can be made that programming of second data to the first target page has failed and the local back-up data can be programmed to a second target page in a second block of the non-volatile memory.

In some embodiments according to the invention, methods of operating a non-volatile memory include programming an alternate target page of the non-volatile memory with first data stored as local back-up data, previously programmed to a primary target page of the non-volatile memory, after determining that programming of subsequently received second data to the primary target page failed.

In some embodiments according to the invention, a method of operating a non-volatile memory includes re-programming verified data, received from a host, to a page of the non-volatile memory without requesting re-transmission of the data from the host.

In some embodiments according to the invention, a non-volatile memory includes a local back-up buffer that is configured to store first data successfully programmed to a primary target page of a non-volatile memory to provide local back-up data and that is configured to provide the local back up data for programming to an alternate target page of the non-volatile memory responsive to failure to program subsequently received data to the primary target page.

In some embodiments according to the invention, a non-volatile memory system includes a non-volatile memory including a first page and a second page and a controller. The controller can include a first volatile memory and a second volatile memory. A processor can be configured to receive and store current page data, received from a host for programming to the first page of the non-volatile memory, in the first volatile memory and can be configured to receive and back-up previous page data, programmed to the first page of the non-volatile memory, in the second volatile memory.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DESCRIPTION OF EMBODIMENTS ACCORDING TO THE INVENTION

The invention now will be described more fully hereinafter with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
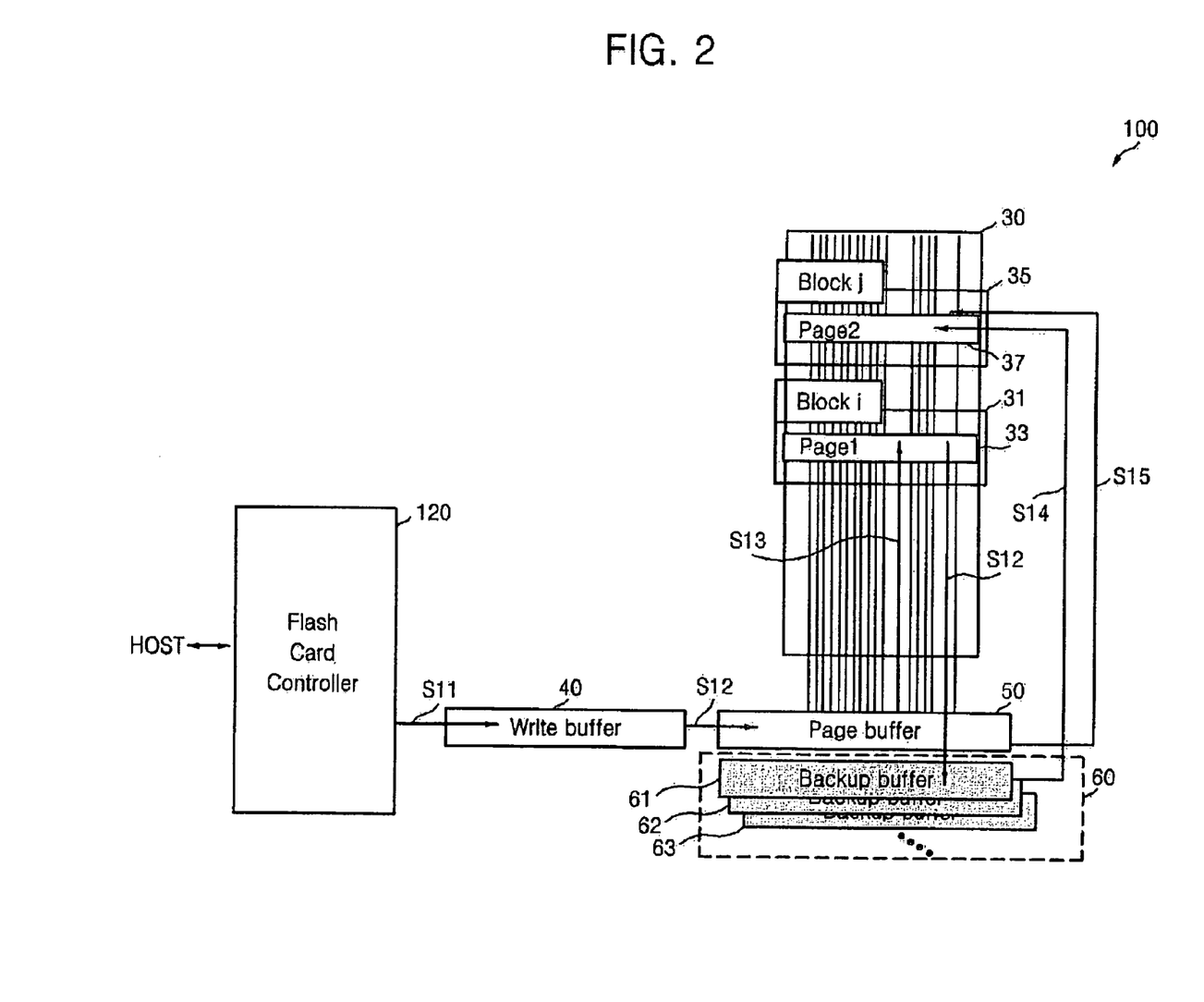
FIG. 2 is a block diagram of non-volatile memory system structure according to an example embodiment of the present invention.

FIG. 2 is a block diagram of non-volatile memory system structure according to an example embodiment of the present invention. Referring to FIG. 2, the non-volatile memory system 100 includes a controller 120 (or a flash card controller), a non-volatile memory 30 (or non-volatile memory device) including a plurality of blocks 31 and 35, a write buffer 40, a page buffer 50, and a back-up buffer 60. The non-volatile memory system 100 may be embodied as a memory card including a secure digital (SD) card or a multi-media card (MMC). The memory card includes a smart card. The non-volatile memory system 100 may be embedded in an electronic device including flash EEPROMs.

In some embodiments according to the invention, the write buffer 40 and page buffer 50 provide a data pipeline the provides data to the nonvolatile memory. In particular, as shown in FIG. 2 the flash card controller 120 (or nonvolatile memory controller) provides the data received from the host to the data pipeline for programming to the nonvolatile memory 30. It will be understood that, as used herein, the term "downstream" is used to indicate the sequence or flow of data from the flash card controller 120 to the nonvolatile memory 30. For example, the page buffer 50 is downstream from the write buffer 40 in the data pipeline. Conversely, as used herein, the term "upstream" is used to indicate the sequence or flow of data from the nonvolatile memory 30 to the flash card controller 120.

The back-up buffer 60 includes a plurality of unit backup buffers 61, 62, 63 . . . . Each size (or volume or capacity) of the plurality of unit backup buffers 61, 62, 63, . . . , for example, Kilobyte may be integer times the size or the volume of the page buffer 50. Therefore, the backup buffer 60 may be integer times the size or the volume of the page buffer 50. The backup buffer 60 can be located in parallel with the page buffer 50 stage of the data pipeline. Moreover, the page buffer 50 and the backup buffer 60 can be controlled separately by the flash card controller 120.

The non-volatile memory 30 includes a plurality of flash EEPROMs and each of the plurality of flash EEPROMs may store a plurality of logical values (e.g., m-bit, where m is a natural number greater than 2). Additionally, the plurality of flash EEPROMs respectively may be embodied as a multi level cell and may store 2 bit or more.

Referring to FIG. 2, a process of programming a second page data (e.g., MSB page data) can be explained as follows. Here, a first page data, e.g., LSB page data (sometimes referred to herein as the primary target page), is supposed to be programmed normally or successfully in a first page 33 of a block i 31. In some embodiments according to the invention, the data programmed to the first page 33 is verified by a read operation to the nonvolatile memory 30.

To program a second page data in a first page 33 of the block i 31, the write buffer 40 receives and stores a second page data output from the controller 120 under a control of the controller 120, which communicates with a host (S11).

And, under a control of the controller 20, once a second page data loaded in a write buffer 40 is loaded to a page buffer 50, a first page data (e.g., LSB page data) programmed in a first page 33 of the block i 31, in which the second page data will be programmed, is simultaneously backed up to the backup buffer 60 (S12) to provide local backup data. In some embodiments according to the invention, the backup data stored in the backup buffer 60 is first verified. In other embodiments according to the invention, the backup data stored in the backup buffer 60 is transferred from the page buffer 50 when the data from the page buffer 50 is programmed to the nonvolatile memory 30. Here, 'simultaneously' may or may not refer to the "exact" same time.

Under a control of the controller 120, second page data loaded in the page buffer 50 in a target page (e.g., a first page 33 of the block i 31) (S13). When the second page data fails to be programmed in the target page (e.g., a first page 33 of the block i 31), the controller 120 programs a first page data backed up in the back-up buffer 60 in another target page or alternate/secondary target page (e.g., a second page 37 of a block j 35) (S14).

After the first page data is successfully programmed in another target page (e.g., the second page 37 of the block j 35), the controller 120 programs the second page data loaded in the page buffer 50 in the another target page (e.g., the second page 37 of the block j 35) (S15).

Accordingly, a non-volatile memory system 100 according to an embodiment of the present invention may reduce time for re-loading because the controller 120 does not load the first page data and the second page data to a write buffer 40 again even when a programming of the second page data fails. Therefore, re-loading burden of the non-volatile memory system is reduced. Additionally, the controller 120 may not need to receive the first page data and the second page data from a host again.

Figure 3:
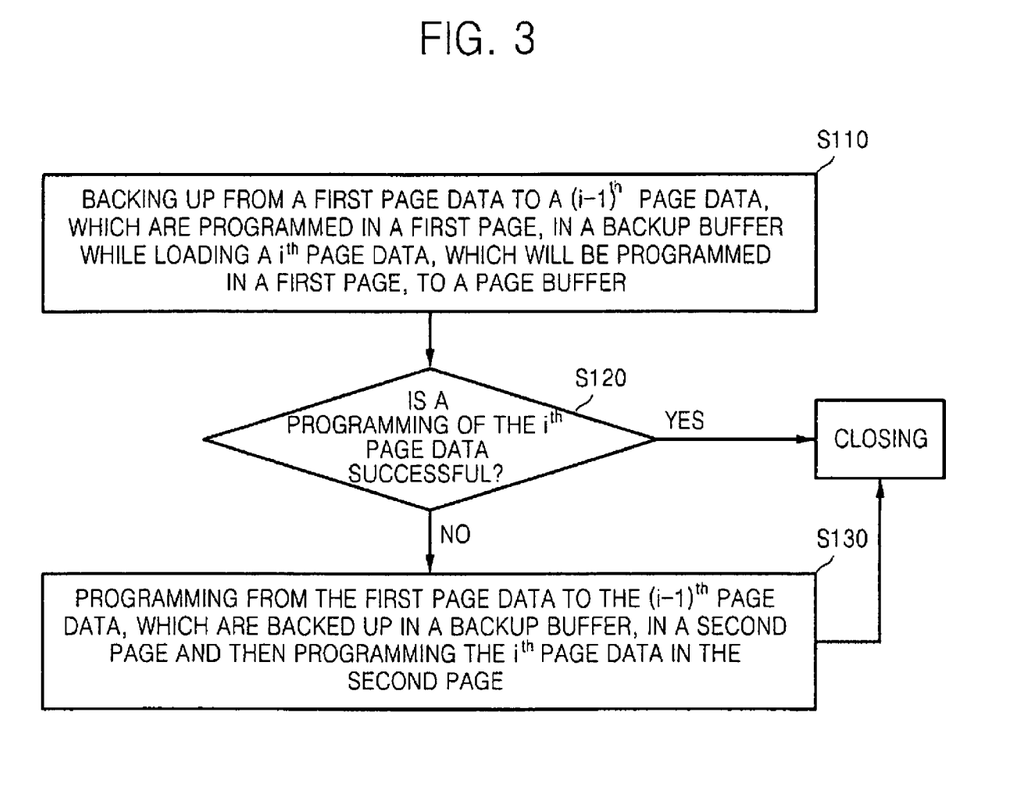
FIG. 3 is a flow chart of page data storing method according to an example embodiment of the present invention.

FIG. 3 is a flow chart of a page data storing method according to an example embodiment of the present invention. Before explaining a page data storing method referring to FIG. 3, the first page 33 and the second page 37 of the non-volatile memory 30 illustrated in FIG. 2 respectively are supposed to include a plurality of non-volatile memory cells and the plurality of non-volatile memory cells are respectively supposed to be able to store m-bits. For example, m may be more than or equal to 2.

For example, under a control of the controller 120, from a first page data to a $(i-1)^{th}$ page data programmed in the first page 33 are backed up in the back-up buffer 60 in order or simultaneously while (or, as soon as) a $i^{th}$ page data, where i is a natural number greater than 1 and less than or equal to m, which will be programmed in a first page 33 of the non-volatile memory 30, is loaded to the page buffer 50 (S12 of FIG. 2 and S110 of FIG. 3).

When a programming of the $i^{th}$ page data in the first page 33 is tried and the trial results in not successful(S120), from the first page data to the $(i-1)^{th}$ page data, which are backed up in the back up buffer 60 under a control of the controller 120, are programmed in the second page 37 of the non-volatile memory 30, and then the $i^{th}$ page data loaded in the page buffer 50 is programmed in the second page 37 when the programming is successful (S130).

Accordingly, the non-volatile memory system 100 according to an embodiment of the present invention may program from a first page data to a $(i-1)^{th}$ page data, which are backed up in the back up buffer 60, automatically in another target page without receiving from a first page data to a $(i-1)^{th}$ page data from the controller 120 even when a $i^{th}$ page data is failed to be programmed, and then, may program the $i^{th}$ page data in the another target page.

Accordingly, the non-volatile memory system 100 according to an embodiment of the present invention has much reduced time for programming $i^{th}$ page data in a target page than a memory system 10 illustrated in FIG. 1. Therefore, the non-volatile memory system 100 has better performance.

Figure 4:
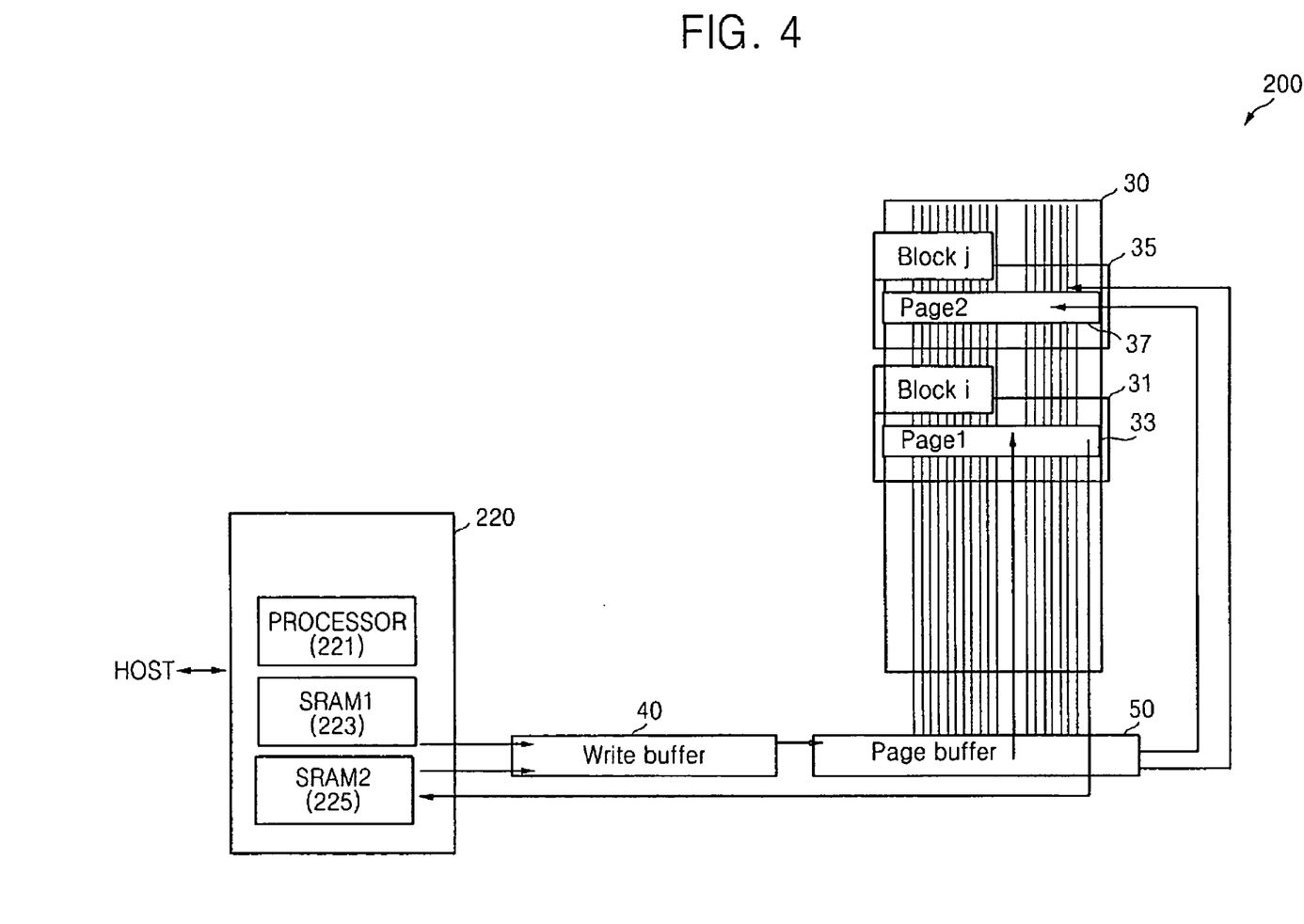
FIG. 4 is a block diagram of non-volatile memory system including a controller according to an example embodiment of the present invention.

FIG. 4 is a block diagram of non-volatile memory system including a controller according to another embodiment of the present invention. A controller 220 according to the present invention includes a first volatile memory 223, a second volatile memory 225, and a processor 221. The first volatile memory 223 and the second volatile memory 225 may respectively be embodied as SRAM.

The processor 221 controls receiving and storing current page data (e.g., LSB page data or MSB page data), which will be programmed in a first page 33 of non-volatile memory 30 output from a host, in the first volatile memory 223. At the same time, the processor 221 also controls reading and backing up previous page data (e.g., LSB page data), which will be programmed in the first page 33 of the non-volatile memory 30, in the second volatile memory 225. The processor 221 may be embodied as hardware or software and it may also be embodied as hardware embedding firmware.

The processor 221, when the current page data is not successfully programmed in the first page, may further control programming the current page data stored in the first volatile memory 223 in a second page 37 after programming the previous page data, which is backed up in the second volatile memory 225, in the second page 37 of the non-volatile memory 30.

The first volatile memory 223 or the second volatile memory 225 may be integer times the size or the volume of page data or the page buffer 50.

Referring to FIG. 4, page data storing method according to another embodiment of present invention can be explained as follows. First of all, the processor 221 of the controller 220 receives and stores LSB page data, which is output from a host, in a first volatile memory 223. The LSB page data stored in the first volatile memory 223 is transferred to the page buffer 50 through a write buffer 40 under a control of the controller 220. The LSB page data transferred to the page buffer 50 under a control of the controller 220 is written or programmed in a first page 33 of a target page, e.g., the first page 33 of the block i 31.

When the LSB page data is successfully programmed in the first page 33, the processor 221 of the controller 220 reads LSB page data programmed in the first page 33 and backups the read LSB page data to a second volatile memory 225 as well as receiving and storing MSB page data, which is output from a host, in a first volatile memory 223. Here, storing the MSB page data in the first volatile memory 223 and backing up the LSB page data to the second volatile memory 225 may be done simultaneously or successively including a predetermined time interval.

The MSB page data stored in the first volatile memory 223 is transferred to a page buffer 50 through a write buffer 40 under a control of the controller 220. The MSB page data transferred to the page buffer 50 under a control of the controller 220 is written or programmed in a target page (e.g., the first page 33 of the block i 31).

When the MSB page data is not successfully programmed in the first page 33, the controller 220 transmits LSB page data, which is backed up in a second volatile memory 225, to the page buffer 50 through a write buffer 40. The controller 220 writes or programs LSB page data, which is re-loaded in a page buffer 50, in another target page (e.g., a second page 37 of a block j 35). And then, when the LSB page data is successfully programmed, the controller 220 writes or programs MSB page data stored in a first volatile memory 223 in another target page, e.g., the second page 37 of the block j 35.

Accordingly, the controller 220 according to the present invention does not need to receive MSB page data from a host and LSB page data again even when a programming of MSB page data is failed.

Figure 5:
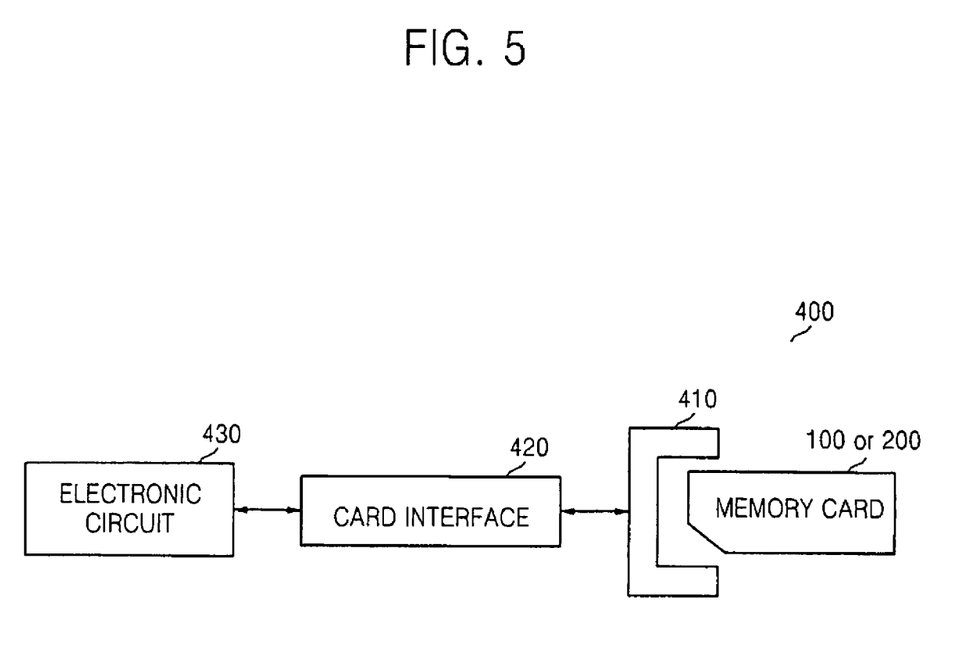
FIG. 5 is a block diagram of electronic system including the non-volatile memory system according to an example embodiment of the present invention.

FIG. 5 is a block diagram of electronic system including the non-volatile memory system according to the example embodiment of the present invention, and FIGS. 6A through 6J illustrate examples of electronic systems including the non-volatile memory systems according to the example embodiment of the present invention.

Figure 6:
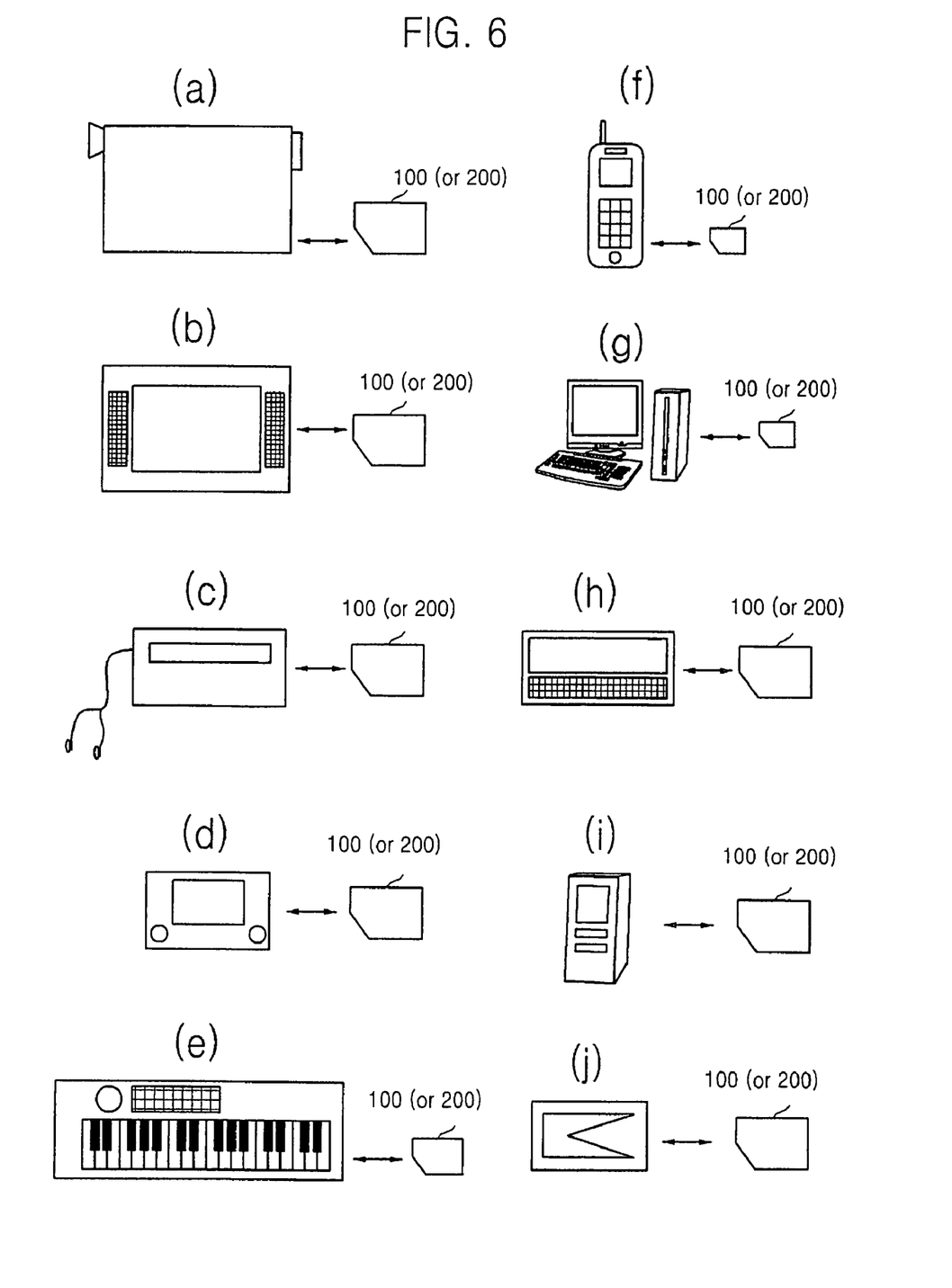
FIGS. 6A to 6J are examples of electronic systems including the non-volatile memory system according to an example embodiment of the present invention.

Referring to FIGS. 5 through 6J, non-volatile memory system 100 or 200 according to the present invention may be embodied as a memory card. The non-volatile memory system 100 or 200 may be used in a video camera (FIG. 6A), a TV (FIG. 6B), a MP3 player (FIG. 6C), an electronic game device (FIG. 6D), an electronic musical instrument (FIG. 6E), a portable communication terminal (FIG. 6F) such as a mobile phone, a personal computer PC (FIG. 6G), a PDA (FIG. 6H), a voice recorder (FIG. 6I), or a PC card or a memory card reader (FIG. 6H) Accordingly, when the video camera (FIG. 6a), the TV (FIG. 6b), the MP3 player (FIG. 6c), the electronic game player (FIG. 6d), the electronic music instrument (FIG. 6e), the portable communication terminal (FIG. 6f), the PC (FIG. 6g), the PDA (FIG. 6h), the voice recorder (FIG. 6i), or the PC card (or a memory card reader; FIG. 5j) respectively includes a card interface 420 and a slot (or a connection unit; 410) connected to the card interface 420, the non-volatile memory system 100 or 200, connected electrically to the slot (or a connection unit; 410), may exchange predetermined data or command with a CPU or a microprocessor (now shown) equipped in an electronic circuit 430 of the video camera (FIG. 6a), the TV (FIG. 6b), the MP3 player (FIG. 6c), the electronic game player (FIG. 6d), the electronic music instrument (FIG. 6e), the portable communication terminal (FIG. 6f), the PC (FIG. 6g), the PDA (FIG. 6h), the voice recorder (FIG. 6i), or the PC card (or a memory card reader; FIG. 5j) through the card interface 420.

As described above, non-volatile memory system according to some example embodiments of the present invention including a backup buffer, which is integer times the size of a page buffer, programs from the first page data to the $(i-1)^{th}$ page data in a target page. And then, when the $i^{th}$ page data fails to be programmed in the target page, the non-volatile memory system may reduce time for receiving and loading from the first page data to the $(i-1)^{th}$ page data transferred from the controller by programming from the first page data to the $(i-1)^{th}$ page data, which are backed up in a backup buffer, in another target page successively without receiving from the first page data to the $(i-1)^{th}$ page data transferred from a controller or a host.

A controller including a plurality of non-volatile memories according to another example embodiment of the present invention may receive and store backed-up previous page data programmed in a target page, in which current page data will be programmed. Therefore, although a programming of the current page data fails, time and burden for re-loading page data can be reduced since the controller does not need to receive the previous page data transmitted from a host again. Therefore, efficiency of the programming operation on multi-level cells gets improved.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed:

1. A non-volatile memory comprising:
   a local back-up buffer configured to store first data successfully programmed to a primary target page of the non-volatile memory to provide local back-up data and configured to provide the local back up data for programming to an alternate target page of the non-volatile memory responsive to failure to program subsequently received second data to the primary target page, further comprising:
   a non-volatile memory controller configured to receive the first and then the second data from a host;
   a data pipeline, coupled to the non-volatile memory controller, and configured to provide the first and second data to the non-volatile memory for programming, wherein the data pipeline comprises:
     a write buffer, coupled to the non-volatile memory controller, configured to receive the first and second data from the non-volatile memory controller; and
     a page buffer, coupled to the write buffer, downstream in the data pipeline from the write buffer to provide a page buffer stage, coupled to the non-volatile memory, wherein the local back-up buffer is located in parallel with the page buffer in the data pipeline.

2. The non-volatile memory according to claim 1 wherein the local back-up buffer is configured to store the first data to provide the local back up data responsive to verification of successful programming of the first data to the primary target page.

3. A non-volatile memory comprising:
   a local back-up buffer configured to store first data successfully programmed to a primary target page of the non-volatile memory to provide local back-up data and configured to provide the local back up data for programming to an alternate target page of the non-volatile memory responsive to failure to program subsequently received second data to the primary target page further comprising:
   a non-volatile memory controller configured to receive the first and then the second data from a host;
   a data pipeline, coupled to the non-volatile memory controller, and configured to provide the first and second data to the non-volatile memory for programming, wherein the data pipeline comprises:
     a first volatile memory configured to receive the first and second data from the non-volatile memory controller;
     a write buffer, downstream from the first volatile memory in the data pipeline and configured to receive the first and second data from the first volatile memory; and
   a page buffer, downstream from the write buffer in the data pipeline, coupled to the non-volatile memory; and
   a second volatile memory, coupled to an input of the page buffer and configured to provide the local back-up data.

4. The non-volatile memory according to claim 3 wherein the first and second volatile memories comprise respective first and second static random access memories included in the non-volatile memory controller.

5. The non-volatile memory according to claim 3 wherein the second volatile memory is configured to store the first data to provide the local back up data responsive to verification of successful programming of the first data to the primary target page.

* * * * *